COMPENSATED DC AMPLIFIER INPUT STAGE EMPLOYING JUNCTION FIELD EFFECT TRANSISTORS

Filed March 9, 1967

United States Patent Office 3,517,325

Patented June 23, 1970

3,517,325

COMPENSATED DC AMPLIFIER INPUT STAGE EMPLOYING JUNCTION FIELD EFFECT TRANSISTORS

David E. Blackmer, Weston, Mass., assignor to Instrumentation Laboratories, Inc., Watertown, Mass., a corporation of Massachusetts Filed Mar. 9, 1967, Ser. No. 621,875
Int. Cl. H03f *1/32, 3/16*
U.S. Cl. 330—23 13 Claims

ABSTRACT OF THE DISCLOSURE

A high performance DC amplifier input stage includes an input junction field effect transistor and a compensation junction field effect transistor connected in series cascade, A bias potentiometer and a temperature responsive bridge network are connected to the cascaded pair ot transistors. The bridge elements are selected so that the bridge is in balance at a selected maximum operating temperature. At that temperature the bias potentiometer is adjusted to achieve a desired input voltage condition. The circuit is then placed at a selected minimum operating temperature and the bridge output is adjusted to achieve the same input voltage condition. The circuit, as adjusted compensates the input transistor over the desired range of operating temperature.

SUMMARY OF INVENTION

This invention relates to electronic circuitry and, more particularly, high performance DC amplifiers exhibiting very low input current.

Such a DC amplifier requires a high input impedance and the input stage must be compatible with that requirement. A characteristic of the high performance DC amplifiers to which this invention relates is that the input potential is permitted to vary only a minute amount over the entire range of permitted change at the output of the amplifier. They are normally used in a high feed back factor configuration. Two of the more important figures of merit on high performance DC amplifiers are the stability of input current and the stability of input voltage offset. It is particularly important to minimize the value of input voltage offset as a function of temperature in the high input impedance device in the input stage of the amplifier. Suitable electronic amplifying devices for such stages include vacuum tubes and field effect transistors of either the junction type or the insulated gate type. The field effect transistor is more satisfactory for use in a high performance DC amplifier due to its stable characteristics which are not subject to change due to aging producing for example DC drift as in the case of the vacuum tubes. However, the junction field effect transistor is commonly utilized in a reverse biased mode and, as such, exhibits a significant offset current, the insulated gate field effect transistor has a limitation due to charge migration in the insulating layer at its gate electrode, and both types of field effect transistor have limitations due to their sensitivity to changes in temperature. The temperature sensitivity of a junction field effect transistor involves two factors: (1) the current in the transistor channel is a function of gate voltage which varies exponentially as a function of temperature; and (2) the resistance of the channel varies as a hyperbolic function of temperature in inverse relation to the response of the first mentioned characteristic.

It is an object of this invention to provide novel and improved circuit for a high performance DC amplifier that uses junction type field effect transistors.

Another object of the invention is to improve the operating characteristics of a high performance DC amplifier circuit as a function of temperature.

Still another object of this invention is to provide a novel and improved circuit for use in a high performance DC amplifier which employs a junction type field effect transistor and compensation for that transistor so that it is suitable for use in such high quality circuitry.

Circuitry constructed in accordance with the invention provides an input stage of a high performance DC amplifier that employs a field effect transistor of the junction type (input transistor) and a second field effect transistor (compensation transistor) that is substantially identical with the first transistor. Each transistor includes a channel, a source electrode, a drain electrode, and a gate electrode. A preferred basis for evaluating the characteristics and match of the two transistors is on the basis of the drain current through each transistor with its gate electrode shorted to its source electrode ($i_d\,ss$). The channels of the two transistors are connected in series cascade. An input circuit is connected to the gate electrode of one of the transistors and an output circuit is connected to the junction between the channels of the two transistors for coupling an output signal to a subsequent stage of the amplifier. The input transistor is operated at a lower than usual source-drain potential (preferably less than 2 volts) and preferably with the source-drain current in the order of 60 microamperes and with the gate electrode maintained at its floating potential (the gate potential at which the gate current is zero, the gate being slightly forward biased in this mode—a typical value being +30 millivolts with respect to the source potential in an N channel device).

It is preferred to utilize in the circuit a temperature responsive element connected to the pair of field effect transistors for modifying the drain current flow in the input transistor as a function of temperature. In the preferred embodiments, this temperature compensation element includes a bridge network having a set of components arranged in bridge configuration so that the bridge is in balance in a predetermined operating temperature (preferably near the maximum expected operating temperatures as adjustment to give minimum current is more sensitive at that point) together with an output potentiometer connected across the bridge network and having an adjustable tap connected to the gate electrode of one of the transistors. It is further preferred to utilize a biasing network (preferably a potentiometer) for providing an adjustment of the current flow through the cascaded pair of transistors so that a zero voltage offset point may be readily established.

This temperature compensation removes substantially completely all first order effects of temperature on offset voltage at the input of the amplifier. The response of the circuit without either the compensation transistor or the compensating network is in the order of 1.5 millivolts/° C. while with the compensating transistor a voltage temperature cofficient of less than 1 millivolt/° C. is obtained which may be reduced further through careful matching of the transistors, and use of both the compensation transistor and the compensation network reduces this value to the order of 0.02–0.05 millivolt/° C.

Other objects, features and advantages of the invention will be seen as the following description of particular embodiments thereof progresses, in conjunction with the drawing, in which.

DESCRIPTION OF PARTICULAR EMBODIMENTS

Figure 1:
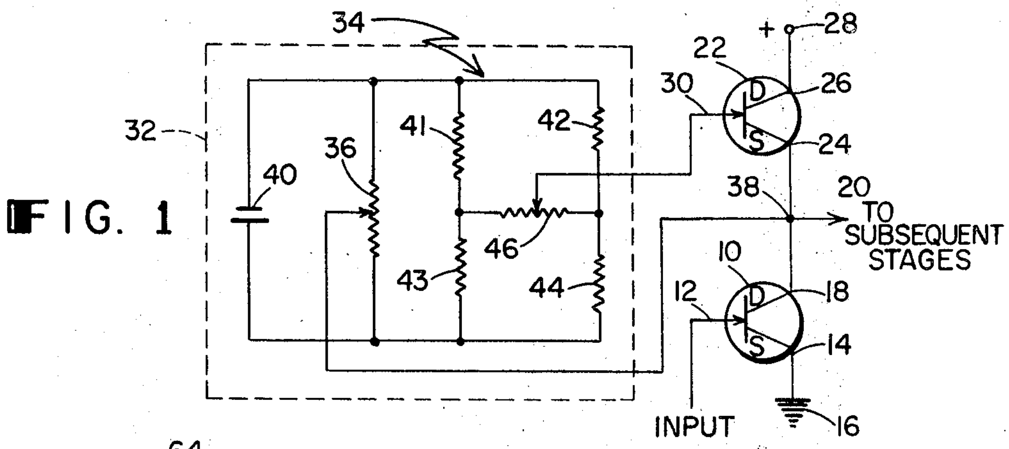
FIG. 1 is a schematic diagram of an input stage of a DC amplifier circuit constructed in accordance with the invention.

As shown in FIG. 1 there is provided a first field effect transistor 10 that has an input signal applied to its gate electrode 12, its source electrode 14 connected to ground terminal 16 and a drain electrode 18 connected to outut line 20 for application of a signal to a subsequent amplifier stage. A matched field effect transistor 22 (that is the same $i_d$ *ss* characteristic) is connected in series cascade with transistor 10, source electrode 24 of transistor 22 being connected to drain electrode 18 of transistor 10 and drain electrode 26 of transistor 22 being connected to positive terminal 28. Its gate electrode 30 may be connected directly to source electrode 24, but preferably a temperature compensation network 32 is connected in circuit between gate 30 and source 24. This network includes a bridge 34, a biasing potentiometer 36, the adjustable tap of which is connected to junction 38 and a potential source 40. The bridge network 34 includes four resistance elements 41–44 and an output potentiometer 46 the adjustable tap of which is connected to gate 30 of transistor 22. The components 41–44 of the bridge are selected in value so that the bridge is balanced (that is, no potential difference across potentiometer 46) at the maximum desired operating temperature.

In adjustment, the circuitry is placed at the temperature at which the bridge is balanced and the bias control (potentiometer 36) is adjusted to produce zero offset current at the input 12. In this condition adjustment of the bridge potentiometer has no effect on the offset voltage as the bridge is in balance. The temperature of the circuitry is then reduced to a value below the minimum operating temperature and the bridge potentiometer 46 is adjusted to give the same offset voltage at input terminal 12 that was observed at the higher temperature. The circuitry is then placed at a temperature (e.g. ambient) between the maximum and minimum temperatures and the offset voltage is checked to verify that temperature compensation has been achieved by the circuitry. This circuitry thus enables adjustment of the compensating components in a simple three-step operation and a single temperature cycle. It provides a high quality input stage of a DC operational amplifier at a relatively low cost.

Figure 2:
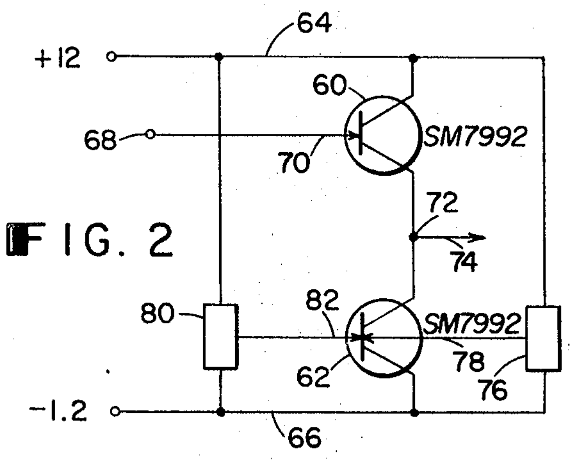
FIG. 2 is a schematic diagram of a second form of input stage for a DC amplifier constructed in accordance with the invention.

A second embodiment is shown in FIG. 2. In that embodiment two field effect transistors 60, 62 are connected in series cascade between a high voltage bus 64 and a common bus 66. The input terminal of the circuit (which preferably is shielded) is connected to gate electrode 70 of transistor 60. The junction 72 between source electrode of transistor 60 and the drain electrode of transistor 62 is connected to output line 74.

Transistor 62 is of the double gate type and has a bias adjust network 76 connected to gate electrode 78 and a temperature compensating network 80 connected to gate electrode 82. The bias adjust network includes a potentiometer connected between high voltage bus 64 and common bus 66 while the temperature network 80 preferably includes a bridge network made up of three resistors and a thermistor which is connected between high voltage bus 64 and common bus 66. An output potentiometer is connected across the bridge in similar manner to potentiometer 46 of bridge 34 shown in FIG. 1 and its adjustable tap is connected to gate electrode 82.

This input stage is adjusted in the same manner as the input stage shown in FIG. 1. That is, at a selected maximum operating temperature the bias control 76 is adjusted to produce the desired minimum offset current at input terminal 68. At this temperature the temperature compensating network has no output and thus no effect on gate electrode 82. The temperature of the circuitry is then reduced to a predetermined minimum value and the temperature compensation network is adjusted to provide the same offset voltage at input terminal 68. The proper setting of this temperature compensation circuitry is then checked by placing the circuitry at an intermediate temperature and measuring the offset voltage at that point, thus achieving high quality temperature compensation in a three-step procedure.

Figure 3:
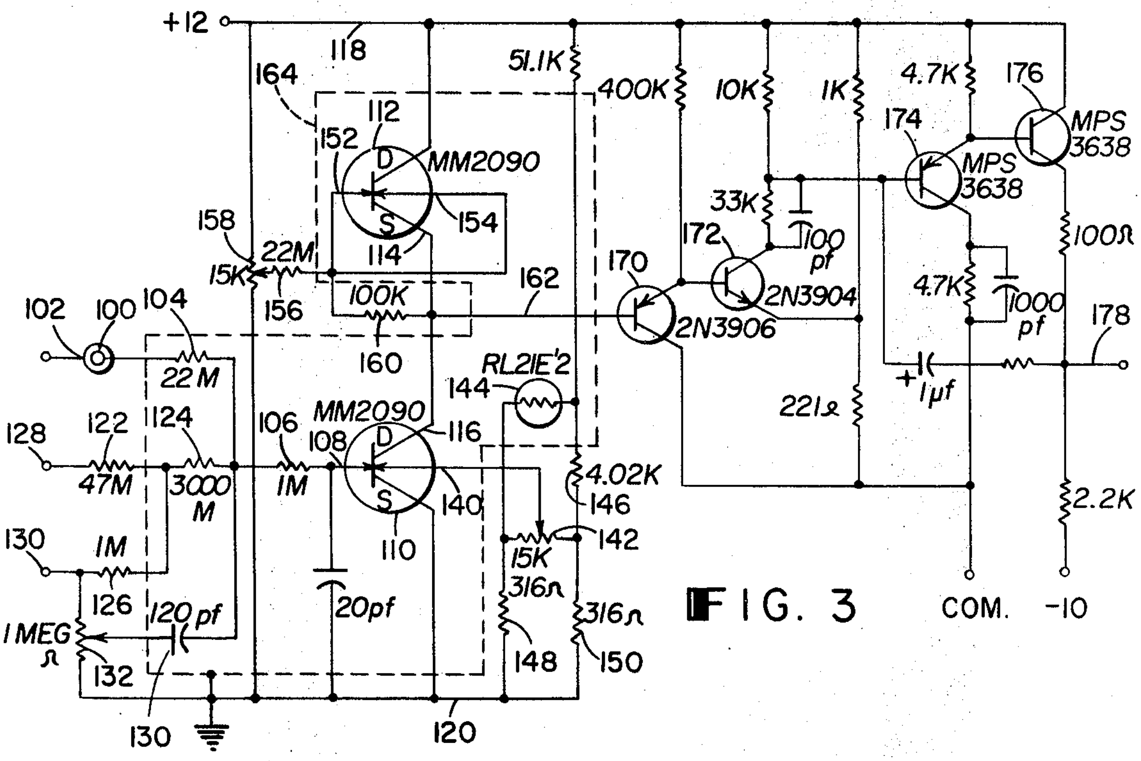
FIG. 3 is a schematic diagram of a direct coupled amplifier incorporating an input stage constructed in accordance with the invention particularly adapted for use with a flame photometer.

An input stage and subsequent amplifying stages of a current mode feedback amplifier is shown in FIG. 3. That circuitry has an input terminal 100 shielded by shield 102 to which an input signal is applied. The input signal is coupled through resistors 104 and 106 to the gate electrode 108 of field effect transistor 110. A matched transistor 112 is connected in series cascade with transistor 110, the source electrode 114 of transistor 112 being connected to the drain electrode 116 of transistor 110 and the series cascade circuit being connected between twelve volt bus 118 and ground bus 120.

Also connected to the input terminal of transistor 110 via resistors 122, 124 and 126 are terminal 128 for connection to the arm of the zero potentiometer and terminal 130 for connection to the arm of the balancing potentiometer of the feedback loop (from terminal 178). Potentiometer 132 with capacitor 134 permits adjustment of the time constant of the feedback loop.

The field effect transistors 110 and 112 are of the double gate type and gate 140 of transistor 110 is connected to bridge potentiometer 142 of a bridge network that includes thermister 144 and resistors 146, 148 and 150. The two gates 152, 154 of transistor 112 are connected together and inturn through resistor 156 to bias adjust potentiometer 158 and that network is connected through resistor 160 to the output line 162 of the input stage of the amplifier. Shield 164 encloses the input stage transistors to provide electrostatic shielding and also to minimize air flow and thus tend to stablilize the temperature of the transistor environment.

Output line 162 is connected to amplifying stages including transistors 170, 172, 174 and 176 which stages provide an output on line 178.

The input transistor 110 (as are all the input transistors in the several disclosed embodiments) is operated in a forward biased condition with a source-drain potential of less than two volts such that its gate electrode 108 is maintained at its floating potential. The input stage is adjusted in the same manner as the circuitry shown in FIG. 1. The input stage is placed at the maximum design temperature and bias potentiometer 158 is adjusted for minimum current offset at input terminal 100. The circuit is then cycled to minimum design temperature and bridge potentiometer 142 is adjusted to produce the same value of voltage offset at the input terminal as at the previous setting. As a check the circuitry is placed at an intermediate temperature and the offset voltage at that point is measured.

Figure 4:
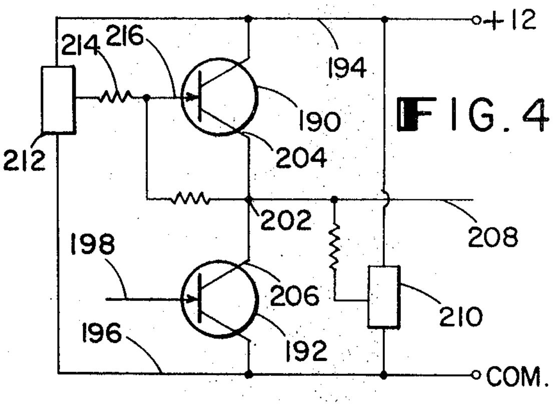
FIG. 4 is a schematic diagram of still another circuit constructed in accordance with the invention.

Still another embodiment is shown in FIG. 4. In that embodiment, an input stage having a gain greater than unity, field effect transistors 190, 192 are connected in series cascade between high voltage bus 194 and common bus 196. Input terminal 198 is connected to gate electrode 200 of transistor 192. The junction 202 between source electrode 204 of transistor 190 and drain electrode 206 at transistor 192 is connected to output line 208. Also connected to junction 202 is temperature compensation network 210 (preferably a bridge network). A bias adjust network 202 is connected, via resistor 214, to gate electrode 216 of transistor 190.

This input stage is adjusted in the same manner as the input stages shown in FIGS. 1–3. That is, at a selected operating temperature the bias control network 212 is adjusted to produce the desired minimum offset current at input terminal 198. The temperature of the environment in which the circuitry is disposed is then changed to a second temperature and the temperature compensation network 210 is adjusted to give the same offset voltage at input terminal 198 as the offset at the first temperature. The circuitry is then placed at a temperature intermediate the first and second temperature and the offset voltage is checked to verify the achievement of temperature compensation.

These circuits are effective to modify the source drain current of a junction field effect transistor so that the operating point as a function of temperature of the input stage of the DC amplifier is maintained at a substantially invarient input voltage offset. While particular embodiments of the invention have been shown and described, various modifications thereof will be apparent to those skilled in the art and it is not intended that the invention be limited to the disclosed embodiments or to details thereof and departures may be made therefrom within the spirit and scope of the invention as defined in the claims.

What is claimed is:

1. A high performance DC amplifier comprising an input stage including an input field effect transistor of the junction type having a channel, a source electrode, a drain electrode, and a gate electrode, a DC compensating circuit including a compensating field effect transistor of the junction type having a channel, a source electrode, a drain electrode, and a gate electrode, the input and compensating transistors being matched as a function of their $i_{dss}$ characteristics and the source electrode of one of said transistors being connected to the drain electrode of the other of said transistors to provide a series cascade connection, a first circuit connected to one electrode of said transistors for adjustably biasing said input junction field effect transistor to provide zero input offset current, and a second circuit connected to another electrode of said transistors and including a temperature compensation network for adjusting the temperature coefficient of offset voltage at the input of the amplifier, said amplifier upon adjustment of said first and second circuits having an input bias current of substantially zero and an input voltage temperature coefficient of less than 1 millivolt/° C.

2. The apparatus as claimed in claim 1 wherein said temperature compensation network includes a bridge having a set of components arranged so that said bridge is in balance at a predetermined operating temperature, and an output circuit connected to said pair of transistors.

3. The apparatus as claimed in claim 1 wherein said temperature compensation network is connected to a gate electrode of one of said transistors.

4. The apparatus as claimed in claim 1 wherein said temperature compensation network is connected to the junction between the channels of said first and second transistors in said series cascade circuit.

5. The apparatus as claimed in claim 1 and further including a feedback loop of high feedback factor connecting the output of the amplifier and said input circuit.

6. The apparatus as claimed in claim 1 wherein said temperature compensation network is connected to said pair of field effect transistors for modifying the drain current flow in said first transistor as a function of temperature.

7. The apparatus as claimed in claim 6 wherein said temperature compensation network includes a bridge having a set of components arranged so that said bridge is in balance at a predetermined operating temperature, and an output circuit including a potentiometer having an adjustable tap connected to said pair of transistors.

8. The apparatus as claimed in claim 7 wherein said temperature compensation network output circuit is connected to a gate electrode of one of said transistors.

9. The apparatus as claimed in claim 7 wherein said temperature compensation network output circuit is connected to the junction between the channels of said first and second transistors in said series cascade circuit.

10. The apparatus as claimed in claim 7 wherein one component of said bridge is a thermistor.

11. The apparatus as claimed in claim 10 wherein said first circuit includes a potentiometer having an adjustable tap connected to a gate electrode of one of said transistors.

12. The amplifier as claimed in claim 1 and further including a third circuit connected to said input junction field effect transistor for applying a source drain potential of less than about two volts to said input transistor.

13. The amplifier as claimed in claim 1 wherein said temperature compensation network includes a bridge circuit connected to said compensating transistor, said bridge circuit being composed of resistance elements and including at least one thermistor.

References Cited

UNITED STATES PATENTS

| | | | |
|---|---|---|---|
| 3,135,926 | 6/1964 | Bockemuehl | 330—38 X |
| 3,281,699 | 10/1966 | Harwood | 307—88.5 X |
| 3,286,189 | 11/1966 | Mitchell et al. | 330—38 X |
| 3,303,346 | 2/1967 | Atkins et al. | 307—88.5 X |
| 3,316,462 | 4/1967 | Moe | 330—22 X |

OTHER REFERENCES

Petersen—"Temperature Control Circuit," IBM Technical Disclosure Bulletin, p. 808, October 1965.

ROY LAKE, Primary Examiner

L. J. DAHL, Assistant Examiner

U.S. Cl. X.R.

330—38